United States Patent
Dosho et al.

(10) Patent No.: US 7,633,421 B2
(45) Date of Patent: Dec. 15, 2009

(54) A/D CONVERTER

(75) Inventors: Shiro Dosho, Osaka (JP); Takashi Morie, Osaka (JP); Yusuke Tokunaga, Hyogo (JP); Shiro Sakiyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 12/093,252

(22) PCT Filed: Jul. 30, 2007

(86) PCT No.: PCT/JP2007/064906
§ 371 (c)(1),
(2), (4) Date: May 9, 2008

(87) PCT Pub. No.: WO2008/032496
PCT Pub. Date: Mar. 20, 2008

(65) Prior Publication Data
US 2009/0237281 A1 Sep. 24, 2009

(30) Foreign Application Priority Data
Sep. 14, 2006 (JP) .............................. 2006-249042

(51) Int. Cl.
*H03M 1/12* (2006.01)
(52) U.S. Cl. ................. 341/155; 341/120; 341/159
(58) Field of Classification Search .......... 341/155, 341/159, 120
See application file for complete search history.

(56) References Cited

U.S. PATENT DOCUMENTS 4,736,189 A * 4/1988 Katsumata et al. .......... 341/120
5,923,559 A * 7/1999 Yamamoto .................. 700/170
6,788,240 B2 * 9/2004 Reyneri et al. .............. 341/159

FOREIGN PATENT DOCUMENTS

| JP | 5-175847 | 7/1993 |
| JP | 10-126266 | 5/1998 |
| JP | 2002-190736 | 7/2002 |
| JP | 2005-347932 | 12/2005 |

OTHER PUBLICATIONS

Yoshikazu Nitta, et al., "27.5 High-Speed Digital Double Sampling with Analog CDS on Column Parallel ADC Architecture for Low-Noise Active Pixel Sensor" ISSCC 2006/Session 27/Image Sensors/27.5, 2006, IEEE.

* cited by examiner

*Primary Examiner*—Jean B Jeanglaude
(74) *Attorney, Agent, or Firm*—McDermott Will & Emery LLP

(57) ABSTRACT

An A/D converter includes: a plurality of A/D conversion circuits (10*a*, 10*b*); an input selection section (20) for selecting the A/D conversion circuit that is not executing A/D conversion to supply analog amounts obtained by sample-holding an input signal; and an output selection section (30) for selecting the A/D conversion circuit that is not executing A/D conversion to output digital amounts obtained from the selected one. Each A/D conversion circuit includes: an input memory portion (11) for sequentially storing the supplied analog amounts in a plurality of analog memory elements (111); an A/D conversion portion (12) having a plurality of A/D conversion elements (121) for converting the analog amounts stored in the analog memory elements to digital amounts; and a shift output portion (13), having a plurality of registers (131) receiving the digital amounts from the A/D conversion elements to hold the digital amounts, for shifting and outputting the digital amounts held in the registers.

7 Claims, 6 Drawing Sheets

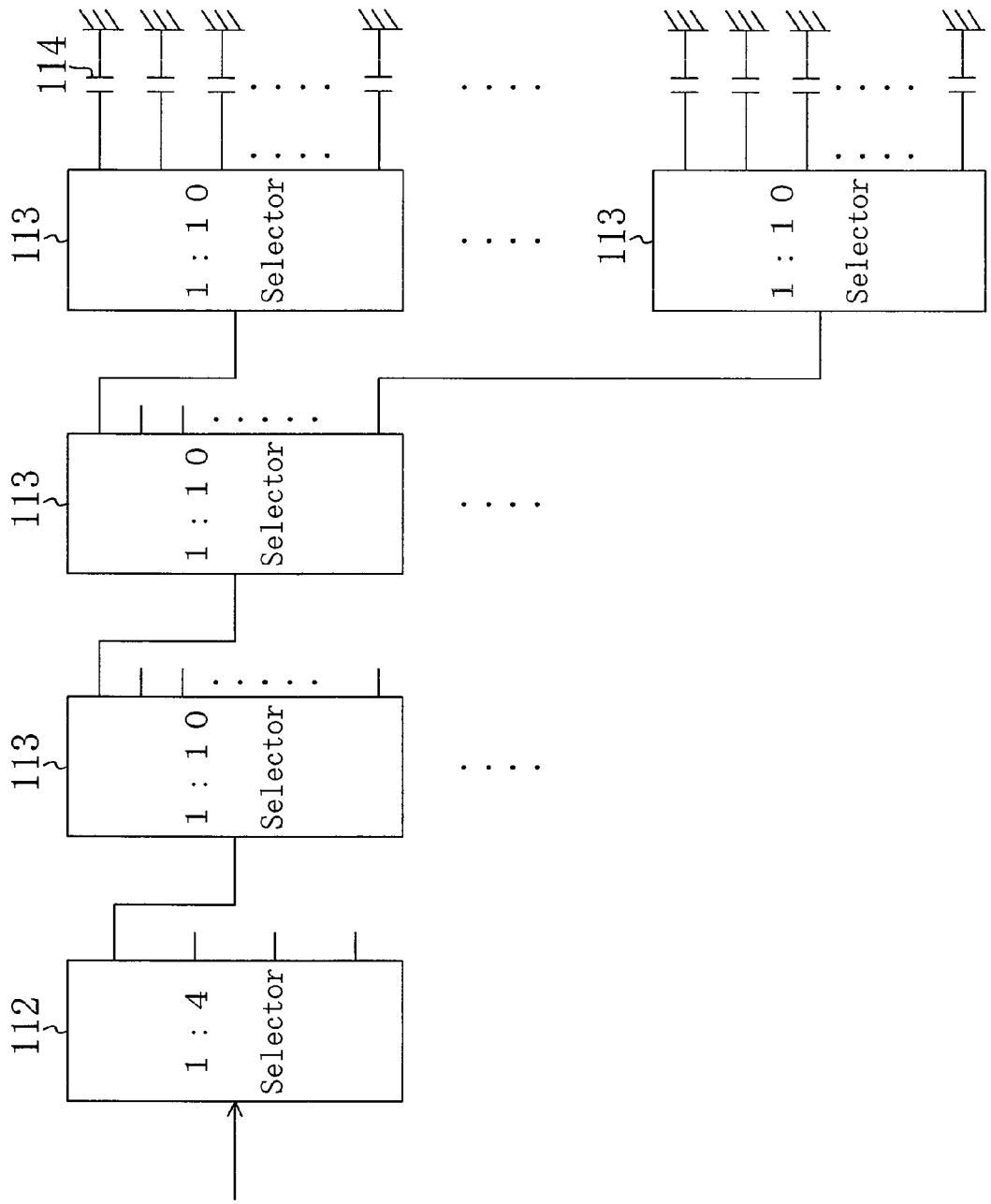

A/D CONVERTER

RELATED APPLICATIONS

This application is the U.S. National Phase under 35 U.S.C. § 371 of International Application No. PCT/JP2007/064906, filed on Jul. 30, 2007, which in turn claims the benefit of Japanese Application No. 2006-249042, filed on Sep. 14, 2006, the disclosures of which Applications are incorporated by reference herein.

TECHNICAL FIELD

The present invention relates to an A/D converter and more particularly to an A/D converter for A/D-converting a telecommunication signal.

BACKGROUND ART

With the recent digitization of communications, performance improvement such as enhancement in bit resolution and increase in conversion speed has been increasingly demanded of A/D converters (ADCs) used in the field of digital communications. With improvement in the performance of ADCs, however, the power consumption thereof often increases. For example, when it is attempted to increase the conversion speed of a sampling ADC, a large current must be fed to permit high-speed charge/discharge of capacitance elements for sampling of an input signal. Considering application of ADCs to mobile equipment such as cellular phones, power reduction will also be necessary in ADCs as well as the performance improvement.

As a high-performance, low-power ADC, a column parallel ADC (column ADC) composed of super-many sampling ADCs is known (see Non-Patent Document 1, for example). In a column ADC, in which hundreds to thousands of sampling ADCs operate in parallel, very high-speed A/D conversion capability can be attained as a whole even though a single sampling ADC is slow in operation.

Non-Patent Document 1: Yoshikazu Nitta et al., "High-Speed Digital Double Sampling with Analog CDS on Column Parallel ADC Architecture for Low-Noise Active Pixel Sensor", ISSCC 2006/SESSION 27/IMAGE SENSORS/27.5

DISCLOSURE OF THE INVENTION

Problems to be Solved by the Invention

Due to its uniqueness in signal input, a column ADC is meant for uses in which an image signal captured in a solid-state imaging device and the like is read in columns and A/D-converted, and is not suitable for uses of A/D-converting an electric signal changing momentarily in real time. For this reason, although a column ADC exhibits high performance, the application thereof is limited to a small field such as image sensing.

In view of the above, an object of the present invention is making a column ADC usable for A/D conversion of a telecommunication signal.

Means for Solving the Problems

To attain the above object, the A/D converter of the present invention includes: a plurality of A/D conversion circuits; an input selection section for selecting any one of the plurality of A/D conversion circuits that is not executing A/D conversion to supply analog amounts obtained by sample-holding an input signal to the selected A/D conversion circuit; an output selection section for selecting any one of the plurality of A/D conversion circuits that is not executing A/D conversion to output digital amounts obtained from the selected A/D conversion circuit, wherein each of the plurality of A/D conversion circuits includes: an input memory portion having a plurality of analog memory elements for storing therein analog amounts, the input memory portion storing the supplied analog amounts in the plurality of analog memory elements sequentially; an A/D conversion portion having a plurality of A/D conversion elements for converting the analog amounts respectively stored in the plurality of analog memory elements to digital amounts; and a shift output portion having a plurality of registers respectively receiving the digital amounts from the plurality of A/D conversion elements to hold the digital amounts therein, the shift output portion shifting and outputting the digital amounts held in the plurality of registers.

With the above configuration, the A/D conversion circuits permitting column parallel A/D conversion are subjected to interleave operation. Hence, an electric signal changing momentarily can be A/D-converted continuously without interruption.

Specifically, the input memory portion may be a charge coupled device. Otherwise, the plurality of analog memory elements may be a plurality of capacitance elements, and the input memory portion may select any one of the plurality of capacitance elements sequentially to store each of the analog amounts supplied from the input selection section in the selected capacitance element. Specifically, the A/D conversion portion may be a column parallel A/D converter.

Specifically, the input selection section may include: a plurality of sample hold circuits each of which is provided for the plurality of A/D conversion circuits respectively and sample-holds a given signal; and a selector for selecting any one of the plurality of sample hold circuits to supply the input signal to the selected sample hold circuit. Otherwise, the input selection section may include: a sample hold circuit for sample-holding the input signal; and a selector for selecting any one of the plurality of A/D conversion circuits to supply analog amounts sample-held by the sample hold circuit to the selected A/D conversion circuit.

Preferably, the input selection section switches the supply destination of the analog amounts every sampling cycle of the input signal.

EFFECT OF THE INVENTION

As described above, according to the present invention, a column ADC can be used for A/D conversion of a telecommunication signal, and thus a high-performance, low-power A/D converter can be implemented. Hence, in software-defined radio and the like, the burden of the front end can be reduced. Also, with the front end being simplified, a multi-band receiver can be formed with a single architecture.

BRIEF DESCRIPTION OF THE DRAWINGS

FIG. 6 is a block diagram of an input memory portion that can be fabricated in a CMOS process.

Figure 1:
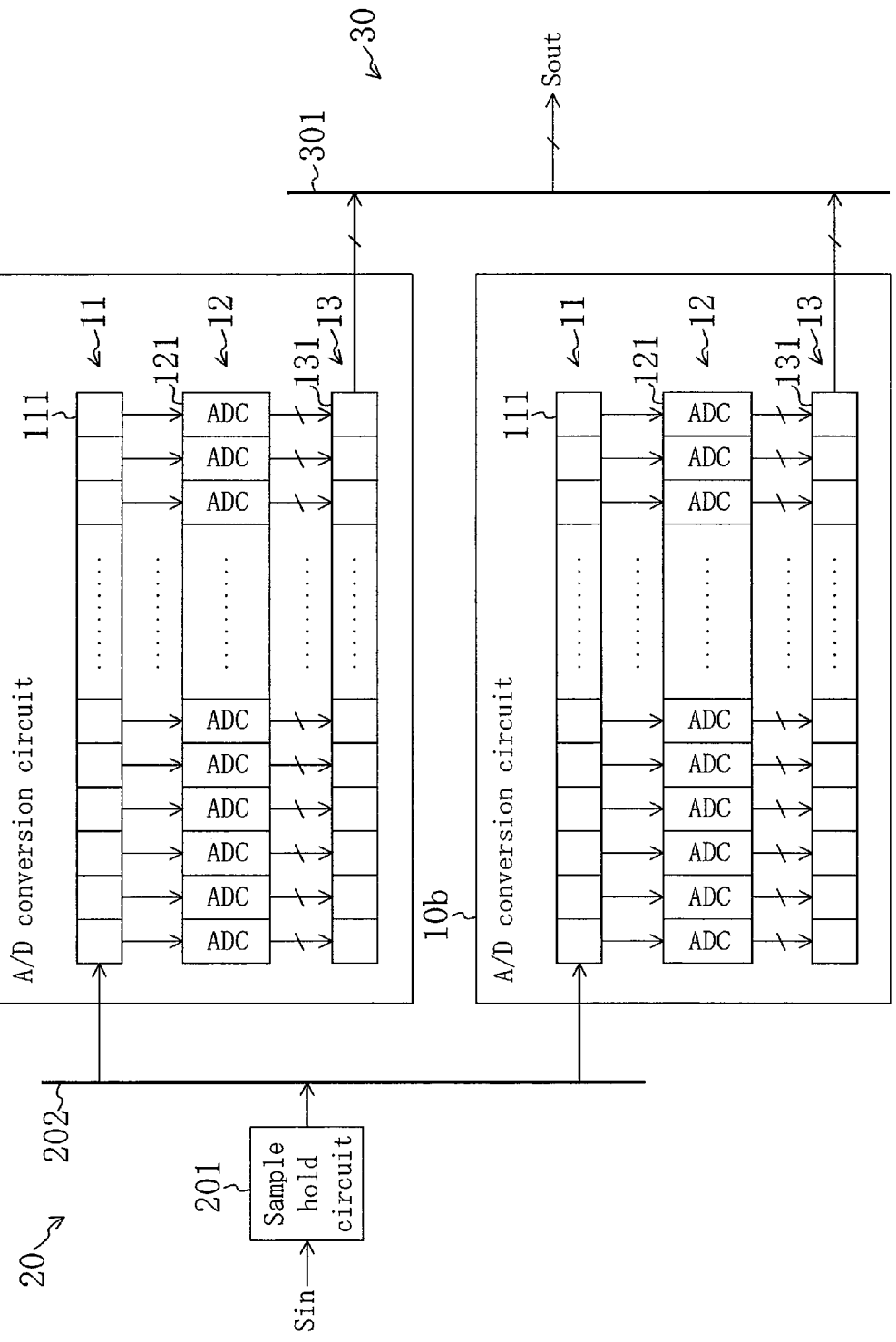
FIG. 1 is a block diagram of an A/D converter of Embodiment 1.

DESCRIPTION OF REFERENCE NUMERALS 10a to 10d A/D conversion circuits
11 Input memory portion
111 MOS capacitor (Analog memory element)
12 A/D conversion portion
121 A/D conversion element
13 Shift output portion
131 Register
20 Input selection section
201, 201a to 201d Sample hold circuits
202, 202a to 202c Selectors
30 Output selection section

BEST MODE FOR CARRYING OUT THE INVENTION

Hereinafter, best modes for carrying out the invention will be described with reference to the relevant drawings.

EMBODIMENT 1

FIG. 1 shows a configuration of an A/D converter of Embodiment 1.The A/D converter, which includes A/D conversion circuits 10a and 10b, an input selection section 20 and an output selection section 30, A/D-converts an inputted signal Sin and outputs the resultant signal Sout.

The A/D conversion circuits 10a and 10b respectively include an input memory portion 11, an A/D conversion portion 12 and a shift output portion 13. The input memory portion 11 can be formed of a charge coupled device (CCD) composed of thousands of MOS capacitors 111 placed adjacent to one another. Each of the MOS capacitors 111 can store charge therein as an analog amount and also transfer the charge to its adjacent MOS capacitor 111. Hence, analog amounts inputted in the initial-stage MOS capacitor 111 (leftmost in FIG. 1) are sequentially transferred to the adjacent MOS capacitor 111, so that the input memory portion 11 can totally store analog amounts of the number of MOS capacitors 111. The A/D conversion portion 12 includes thousands of A/D conversion elements 121 corresponding one-to-one to the MOS capacitors 111, and can be formed of a column ADC. Each of the A/D conversion elements 121 receives the analog amount stored in the corresponding MOS capacitor 111 and converts the analog amount to a digital amount. The shift output portion 13 can be formed of a shift register including thousands of registers 131 corresponding one-to-one to the A/D conversion elements 121. Each of the registers 131 receives the digital amount from the corresponding A/D conversion element 121 and holds the digital amount. The shift output portion 13 shifts and outputs the digital amounts held in the registers 131.

Figure 2:
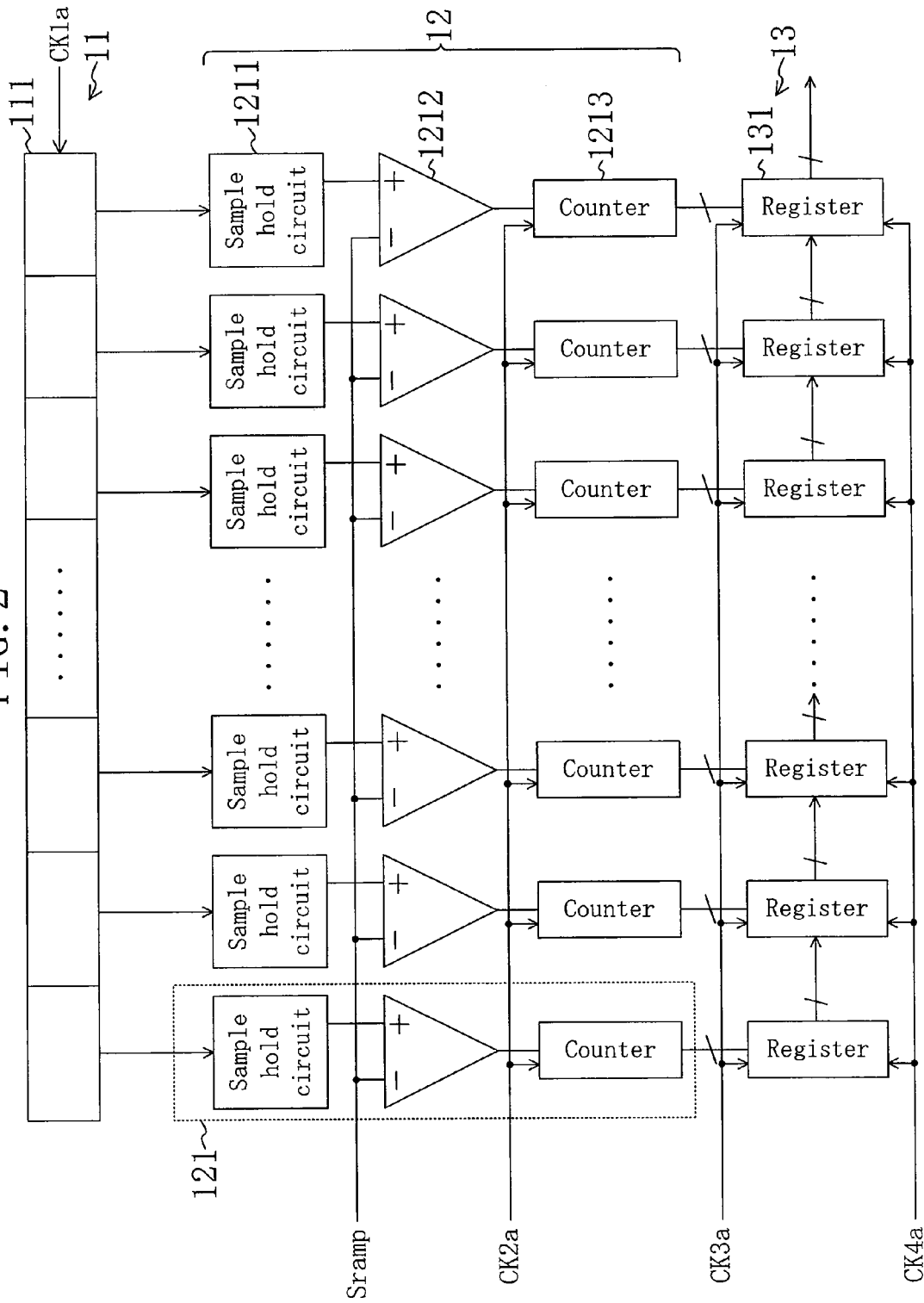
FIG. 2 is a detailed block diagram of an A/D conversion circuit shown in FIG. 1.

FIG. 2 shows a detailed configuration of the A/D conversion circuit 10a. Each MOS capacitor 111 transfers charge to its adjacent MOS capacitor 111 in synchronization with a clock signal CK1a. Each A/D conversion element 121 is formed as a sampling ADC including a sample hold circuit 1211, a comparator 1212 and a counter 1213. The sample hold circuit 1211 sample-holds the analog amount received from the corresponding MOS capacitor 111. The comparator 1212 compares the analog amount received from the corresponding sample hold circuit 1211 with a ramp signal Sramp. The counter 1213 counts the number in synchronization with a clock signal CK2a until the output of the comparator 1212 changes, that is, the analog amount received from the sample hold circuit 1211 becomes equal to the level of the ramp signal Sramp. The register 131 latches the count value of the counter 1213 in synchronization with a clock signal CK3a and also shifts the holding digital amount in synchronization with a clock signal CK4a. Note that to output the A/D conversion results of the signal Sin in order of the time-series input of the signal Sin, the digital amounts are sequentially outputted starting from that in the register 131 corresponding to the MOS capacitor 111 located at the end (rightmost in FIG. 1) in the input memory portion 11.

The A/D conversion circuit 10b has substantially the same configuration as the A/D/ conversion circuit 10a described above, except that it operates in synchronization with clock signals CK1b to CK4b in place of the clock signals CK1a to CK4a.

Referring back to FIG. 1, the input selection section 20 includes a sample hold circuit 201 and a selector 202. The sample hold circuit 201 sample-holds the signal Sin and outputs analog amounts. The selector 202 supplies the analog amounts outputted from the sample hold circuit 201 to the A/D conversion circuit 10a or 10b whichever is not executing A/D conversion. The output selection 301 is composed of one selector 301. The selector 301 obtains digital amounts from the A/D conversion circuit 10a or 10b whichever is not executing A/D conversion and outputs the digital amounts as the signal Sout.

The operation of the A/D converter of this embodiment will be described. The A/D conversion circuits 10a and 10b respectively execute the following three operations sequentially: storage of a plurality of analog amounts by the input memory portion 11, parallel A/D conversion by the A/D conversion portion 12, and shift output of digital amounts by the shift output portion 13. In this relation, the input memory portion 11 and the shift output portion 13 can operate independently from each other. In other words, while the shift output portion 13 is shifting and outputting the digital amounts held in the registers 131, the input memory portion 11 can store new analog amounts therein. Hence, the A/D conversion circuits 10a and 10b are configured so that while only the input memory portion 11 and the shift output portion 13 are allowed to operate in one of the A/D conversion circuits 10a and 10b, only the A/D conversion portion 12 is allowed to operate in the other A/D conversion circuit. These operations are switched between the A/D conversion circuits 10a and 10b alternately and made continuously. In other words, the A/D conversion circuits 10a and 10b are subjected to interleave operation.

Figure 3:
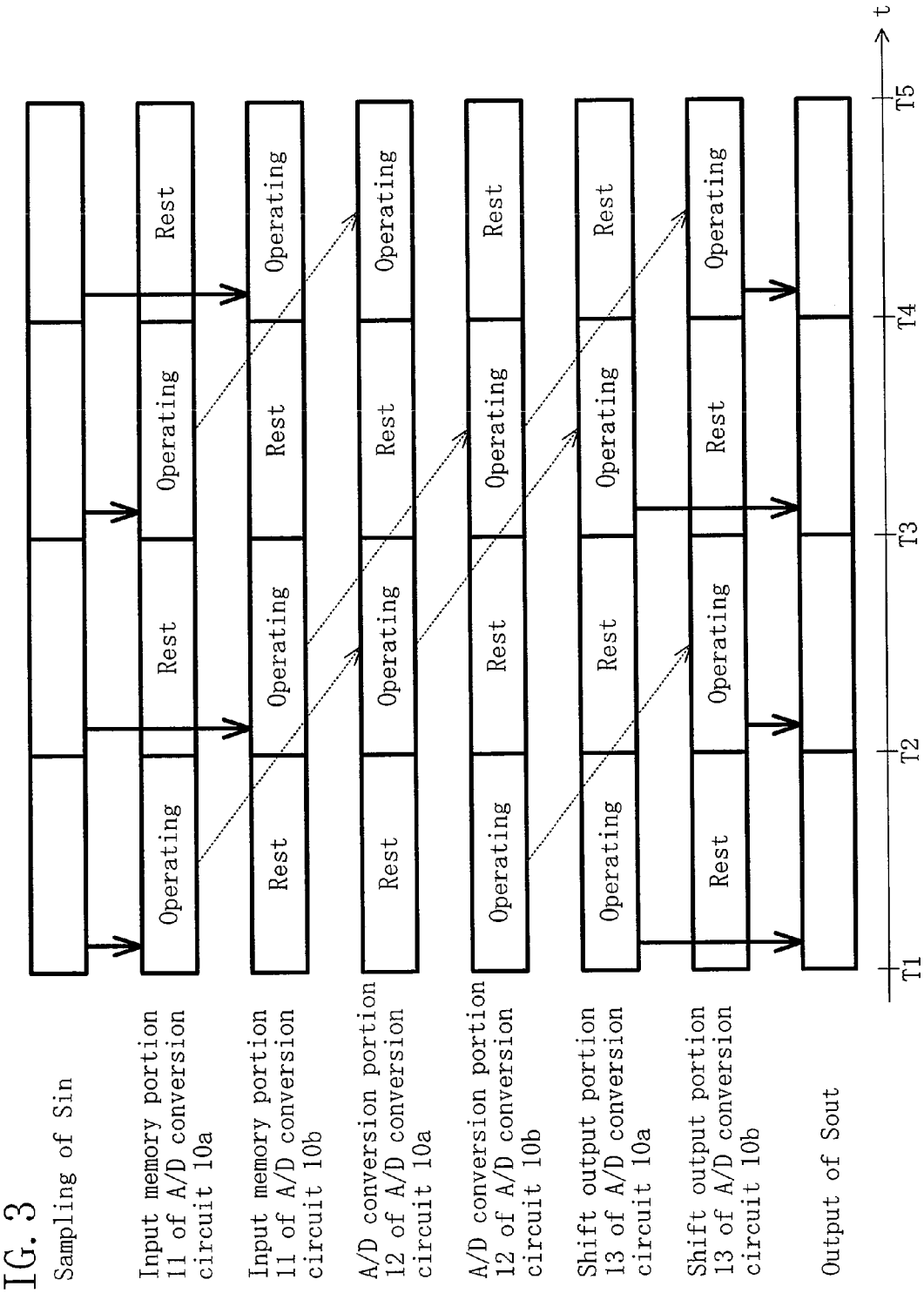
FIG. 3 is a view representing interleave operation of the A/D converter of FIG. 1.
Figure 4:
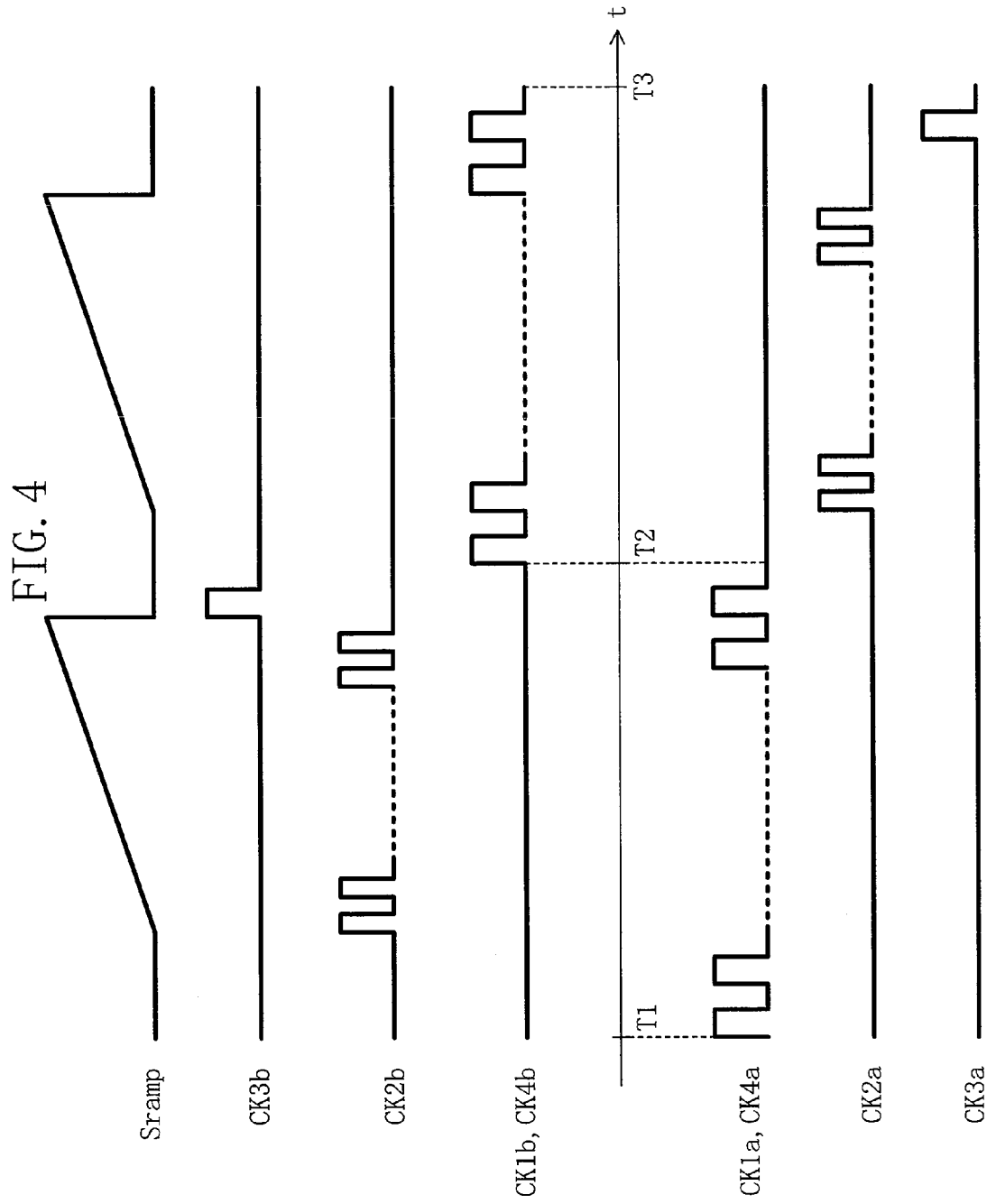
FIG. 4 is a graph representing the active/non-active states of various clock signals related to the interleave operation.

FIG. 3 shows the interleave operation of the A/D converter, and FIG. 4 is a graph showing the active/inactive states of various clock signals related to the interleave operation. During the period from time T1 to time T2, the clock signals CK2a and CK3a are made inactive while the clock signals CK1a and CK4a are made active, so that the A/D conversion portion 12 is at rest while the input memory portion 11 and the shift output portion 13 are operating in the A/D conversion circuit 10a. In this operation state, the digital amounts are outputted from the shift output portion 13 as the signal Sout, and also the sampling results of the signal Sin are newly stored in the input memory portion 11.

During the same period, the clock signals CK1b and CK4b are made inactive while the clock signals CK2b and CK3b are made active, so that the input memory portion 11 and the shift output portion 13 are at rest while the A/D conversion portion 12 are operating in the A/D conversion circuit 10b. Thus, the A/D conversion elements 121 of the A/D conversion portion 12 count the clock signal CK2*b* until the analog amounts stored in the corresponding MOS capacitors 111 of the input memory portion 11 reach the level of the ramp signal Sramp. At the timing of rising of the clock signal CK3*b*, the count values of the A/D conversion elements 121 are latched to the corresponding registers 131 of the shift output portion 13.

During the period from time T2 to time T3, the operations of the A/D conversion circuits 10*a* and 10*b* are reversed. That is, the clock signals CK1*a* and CK4*a* are made inactive while the clock signals CK2*a* and CK3*a* are made active, so that the input memory portion 11 and the shift output portion 13 are at rest while the A/D conversion portion 12 are operating in the A/D conversion circuit 10*a*. Also, the clock signals CK2*b* and CK3*b* are made inactive while the clock signals CK1*b* and CK4*b* are made active, so that the A/D conversion portion 12 is at rest while the input memory portion 11 and the shift output portion 13 are operating in the A/D conversion circuit 10*b*. During the next period from time T3 to time T4, the operation state is the same as during the period from time T1 to time T2. During the next but one period from time T4 to time T5, the operation state is the same as during the period from time T2 to time T3.

Focusing attention on the data flow, the signal Sin inputted during the period from time T1 to time T2 is temporarily stored in the input memory portion 11 of the A/D conversion circuit 10*a*, A/D-converted by the A/D conversion portion 12 during the period from time T2 to T3, and outputted from the shift output portion 13 as the signal Sout during the period from time T3 to time T4. Likewise, the signal Sin inputted during the period from time T2 to time T3 is temporarily stored in the input memory portion 11 of the A/D conversion circuit 10*b*, A/D-converted by the A/D conversion portion 12 during the period from time T3 to T4, and outputted from the shift output portion 13 as the signal Sout during the period from time T4 to time T5.

As described above, by subjecting the A/D conversion circuits 10*a* and 10*b* to the interleave operation, the inputted signal Sin can be continuously A/D-converted without interruption. Also, the A/D conversion portions 12 are only required to complete the A/D conversion by the time when thousands of analog amounts have been stored in the input memory portion 11. Therefore, even if the sampling rate of the signal Sin in the input selection section 20 is very high, good time is secured for the A/D conversion portions 12 to perform the A/D conversion. The A/D converter of this embodiment can therefore attain high-speed operation. Also, as the A/D conversion portions 12, it is possible to adopt ADCs permitting A/D conversion with high bit resolution although being somewhat low in speed. Thus, the A/D converter of this embodiment can attain A/D conversion with high bit resolution.

As described above, in this embodiment, a column ADC used in the field of image sensing can be used for A/D conversion of an electric signal changing momentarily. Hence, high-speed A/D conversion with high bit resolution can be attained with reduced power consumption.

EMBODIMENT 2

Figure 5:
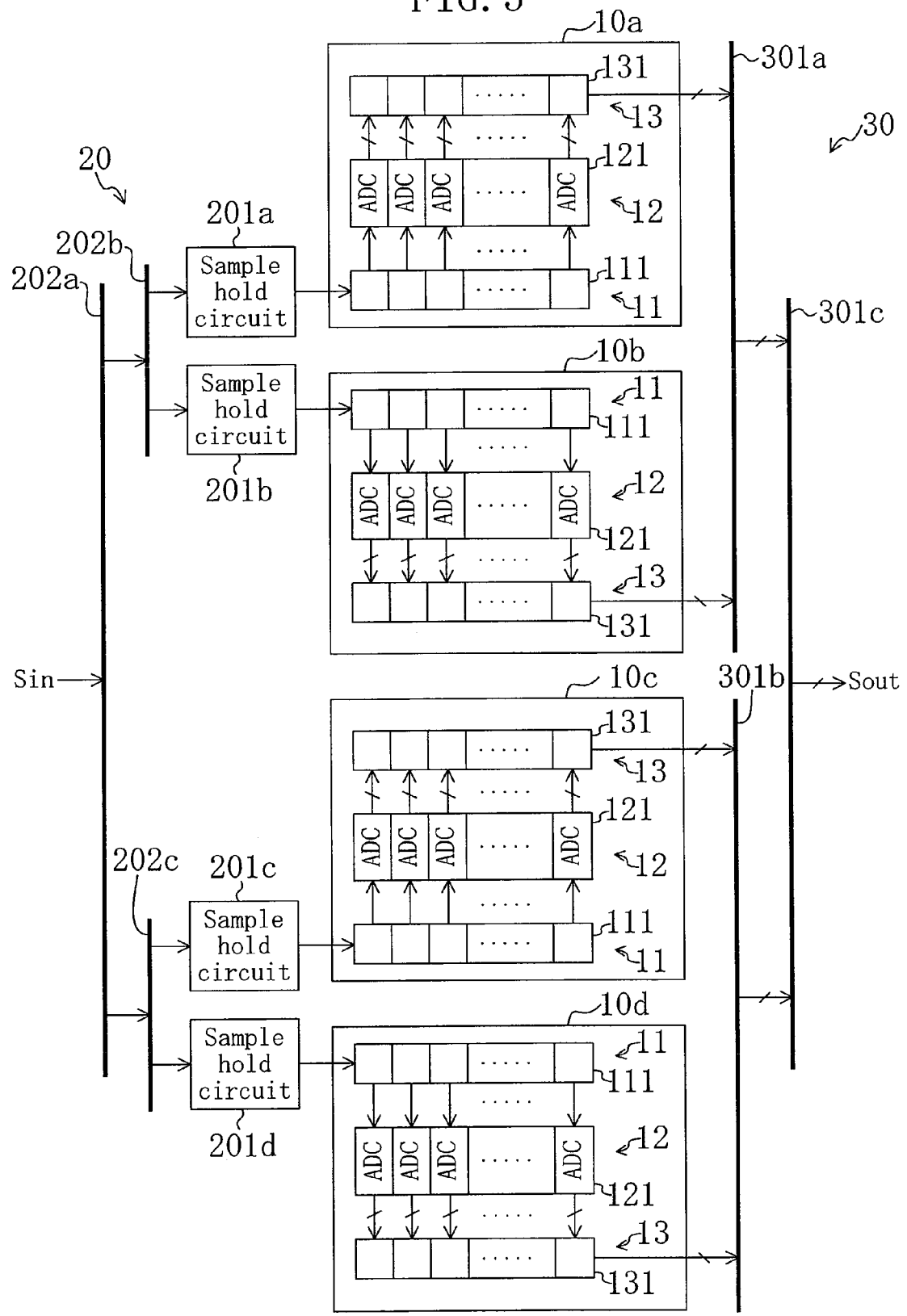
FIG. 5 is a block diagram of an A/D converter of Embodiment 2.

FIG. 5 shows a configuration of an A/D converter of Embodiment 2. The A/D converter, which includes A/D conversion circuits 10*a*, 10*b*, 10*c* and 10*d*, an input selection section 20 and an output selection section 30, A/D-converts an inputted signal Sin and outputs the resultant signal Sout. The A/D conversion circuits 10*a* and 10*b* in a pair and the A/D conversion circuits 10*c* and 10*d* in another pair are subjected to the interleave operation described above to execute A/D conversion. Also, analog amounts are alternately inputted into the two A/D conversion circuits in each pair. The A/D conversion circuits 10*a* to 10*d* are substantially the same as the A/D conversion circuits 10*a* and 10*b* in Embodiment 1, and thus description thereof is omitted here.

The input selection section 20 includes sample hold circuits 201*a*, 201*b*, 201*c* and 201*d* and selectors 202*a*, 202*b* and 202*c*. The sample hold circuits 201*a* to 201*d* respectively sample-hold a given signal and supply the resultant analog amounts to the A/D conversion circuits 10*a* to 10*d*. The selector 202*b* switches its output destination between the sample hold circuits 201*a* and 201*b* alternately at the sampling cycle of the signal Sin, to output the signal received from the selector 202*a* to the current output destination. Likewise, the selector 202*c* switches its output destination between the sample hold circuits 201*c* and 201*d* alternately at the sampling cycle of the signal Sin, to output the signal received from the selector 202*a* to the current output destination. The selector 202*a*, receiving the signal Sin, selects the selector 202*b* or 202*c* whichever is to supply the analog amounts to the pair, out of the paired A/D conversion circuits 10*a* and 10*b* and the paired A/D conversion circuits 10*c* and 10*d*, which is not executing A/D conversion, to output the signal Sin to the selected selector.

Hence, by interleaving the supply of analog amounts to the A/D conversion circuits 10*a* to 10*d*, good time is secured for the sample-hold operation by the sample hold circuits 201*a* to 201*d* and the storage and transfer of the analog amounts by the input memory portions 11. Therefore, even if the operations of the sample hold circuits 201*a* to 201*d* and the input memory portions 11 are somewhat slow, the operation of the A/D converter is not determined by these operation speeds but can be kept at high speed. In other words, the operation speed of the A/D converter of this embodiment is further improved.

The output selection section 30 includes selectors 301*a*, 301*b* and 301*c*. The selector 301*a* switches its input source between the A/D conversion circuits 10*a* and 10*b* alternately at the sampling cycle of the signal Sin, to output digital amounts supplied from the input source to the selector 301*c*. Likewise, the selector 301*b* switches its input source between the A/D conversion circuits 10*c* and 10*d* alternately at the sampling cycle of the signal Sin, to output digital amounts supplied from the input source to the selector 301*c*. The selector 301*c* selects the selector 301*a* or 301*b* whichever is obtaining digital amounts from the pair, out of the paired A/D conversion circuits 10*a* and 10*b* and the paired A/D conversion circuits 10*c* and 10*d*, which is not executing A/D conversion, to obtain the digital amounts from the selected selector and output the digital amounts as the signal Sout. In this way, by interleaving the output of the digital amounts from the A/D conversion circuits 10*a* to 10*d*, the A/D-converted results of the signal Sin can be outputted in right order.

As described above, in this embodiment, in which the supply of analog amounts to the A/D conversion circuits is interleaved, higher-speed A/D conversion is attained. Further higher-speed operation can be attained with supply of analog amounts to three or more A/D conversion circuits under interleave operation.

The above description is based on the premise that the input memory portion 11 of each of the A/D conversion circuits 10*a* to 10*d* is formed of a CCD. The CCD fabrication process is different from the CMOS fabrication process for the A/D conversion portion 12, the shift output portion 13 and the like. Some measures should therefore be taken including bonding chips fabricated in the different processes together. Contrary to this, FIG. 6 shows a configuration of the input memory portion 11 that can be fabricated in a CMOS process. The input memory portion 11 includes a 1:4 selector 112, a plurality of 1:10 selectors 113 and a plurality of capacitance elements 114. Following the selector 112 as the initial stage, the selectors 113 are placed in three stages. A total of four thousand of capacitance elements 114 are therefore provided. By controlling the selectors 112 and 113 appropriately, any one of the capacitance elements 114 can be selected, to store an analog amount in the selected capacitance element 114. In this way, by giving the input memory portion 11 a circuit configuration that can be fabricated in a CMOS fabrication process, all the components of the A/D converter can be fabricated in the same process.

INDUSTRIAL APPLICABILITY

The A/D converter of the present invention, having high performance and low power consumption, is especially useful in mobile-use software-defined radio, multiband receivers and the like.

The invention claimed is:

1. An A/D converter comprising:
   a plurality of A/D conversion circuits;
   an input selection section for selecting any one of the plurality of A/D conversion circuits that is not executing A/D conversion to supply analog amounts obtained by sample-holding an input signal to the selected A/D conversion circuit;
   an output selection section for selecting any one of the plurality of A/D conversion circuits that is not executing A/D conversion to output digital amounts obtained from the selected A/D conversion circuit,
   wherein each of the plurality of A/D conversion circuits comprises:
   an input memory portion having a plurality of analog memory elements for storing therein analog amounts, the input memory portion storing the supplied analog amounts in the plurality of analog memory elements sequentially;
   an A/D conversion portion having a plurality of A/D conversion elements for converting the analog amounts respectively stored in the plurality of analog memory elements to digital amounts; and
   a shift output portion having a plurality of registers respectively receiving the digital amounts from the plurality of A/D conversion elements to hold the digital amounts therein, the shift output portion shifting and outputting the digital amounts held in the plurality of registers.

2. The A/D converter of claim 1, wherein the input memory portion is a charge coupled device.

3. The A/D converter of claim 1, wherein the plurality of analog memory elements are a plurality of capacitance elements, and
   the input memory portion selects any one of the plurality of capacitance elements sequentially to store each of the analog amounts supplied from the input selection section in the selected capacitance element.

4. The A/D converter of claim 1, wherein the A/D conversion portion is a column parallel A/D converter.

5. The A/D converter of claim 1, wherein the input selection section comprises:
   a plurality of sample hold circuits each of which is provided for the plurality of A/D conversion circuits respectively and sample-holds a given signal; and
   a selector for selecting any one of the plurality of sample hold circuits to supply the input signal to the selected sample hold circuit.

6. The A/D converter of claim 1, wherein the input selection section comprises:
   a sample hold circuit for sample-holding the input signal; and
   a selector for selecting any one of the plurality of A/D conversion circuits to supply analog amounts sample-held by the sample hold circuit to the selected A/D conversion circuit.

7. The A/D converter of claim 1, wherein the input selection section switches the supply destination of the analog amounts every sampling cycle of the input signal.

* * * * *